(12) United States Patent
Kim et al.

(10) Patent No.: US 12,408,538 B2
(45) Date of Patent: Sep. 2, 2025

(54) ANTI-PEEPING DISPLAY DEVICE

(71) Applicant: Samsung Display Co., Ltd., Yongin-Si (KR)

(72) Inventors: Yong Seok Kim, Seoul (KR);
Youngchan Kim, Incheon (KR);
Jeongwoo Park, Yongin-si (KR);
Minhee Son, Anyang-si (KR); Saet Byeol Shin, Cheonan-si (KR);
Byeong-Hee Won, Incheon (KR)

(73) Assignee: Samsung Display Co., Ltd., Yongin-si (KR)

( * ) Notice: Subject to any disclaimer, the term of this patent is extended or adjusted under 35 U.S.C. 154(b) by 527 days.

(21) Appl. No.: 17/852,644

(22) Filed: Jun. 29, 2022

(65) Prior Publication Data

US 2023/0113976 A1 Apr. 13, 2023

(30) Foreign Application Priority Data

Oct. 12, 2021 (KR) .................. 10-2021-0134936

(51) Int. Cl.
*H10K 50/858* (2023.01)
*H10K 50/854* (2023.01)
(Continued)

(52) U.S. Cl.
CPC ......... *H10K 50/858* (2023.02); *H10K 50/854* (2023.02); *H10K 50/865* (2023.02); *H10K 59/50* (2023.02)

(58) Field of Classification Search
CPC ...... H10K 50/858; H10K 59/38; H10K 59/50; H10K 30/87; H10K 59/879; H10K 50/854; H10K 50/865; H10K 59/8792
See application file for complete search history.

(56) References Cited

U.S. PATENT DOCUMENTS 8,033,706 B1 * 10/2011 Kelly .................. G02B 6/0043
362/617
2016/0124266 A1 * 5/2016 Kim .................. G02F 1/133611
349/67

(Continued)

FOREIGN PATENT DOCUMENTS

JP 2020-134561 A 8/2020
KR 20170086110 A * 7/2017 .......... G02B 6/0036

(Continued)

*Primary Examiner* — Ratisha Mehta
*Assistant Examiner* — Timothy Edward Duren
(74) *Attorney, Agent, or Firm* — Innovation Counsel LLP

(57) ABSTRACT

A display device includes a substrate including a display area including a light emitting area, and a peripheral area surrounding at least a portion of the display area, a first light emitting element disposed in the light emitting area on the substrate and emitting a first light, a light guide layer disposed on the first light emitting element, and transmitting a second light incident from the peripheral area to the display area, a first low refractive layer disposed on the light guide layer and having a refractive index smaller than a refractive index of the light guide layer, a second low refractive layer disposed under the light guide layer and having a refractive index smaller than a refractive index of the light guide layer and a first light control layer disposed on the first low refractive layer and having a first opening exposing the light emitting area.

20 Claims, 11 Drawing Sheets

(51) Int. Cl.
 *H10K 50/86* (2023.01)
 *H10K 59/50* (2023.01)

(56) References Cited

U.S. PATENT DOCUMENTS

2020/0081173 A1* 3/2020 Tak ...................... H10K 50/856
2020/0303684 A1* 9/2020 Kim ...................... H10K 59/12
2024/0085732 A1* 3/2024 Sui ...................... H01L 25/0753

FOREIGN PATENT DOCUMENTS

| KR | 20180031125 A * | 3/2018 | ....... G02F 1/133553 |
| KR | 10-2018-0129345 A | 12/2018 | |
| KR | 10-2020-0040980 A | 4/2020 | |
| WO | WO-2022163811 A1 * | 8/2022 | ............... G02B 5/20 |

* cited by examiner

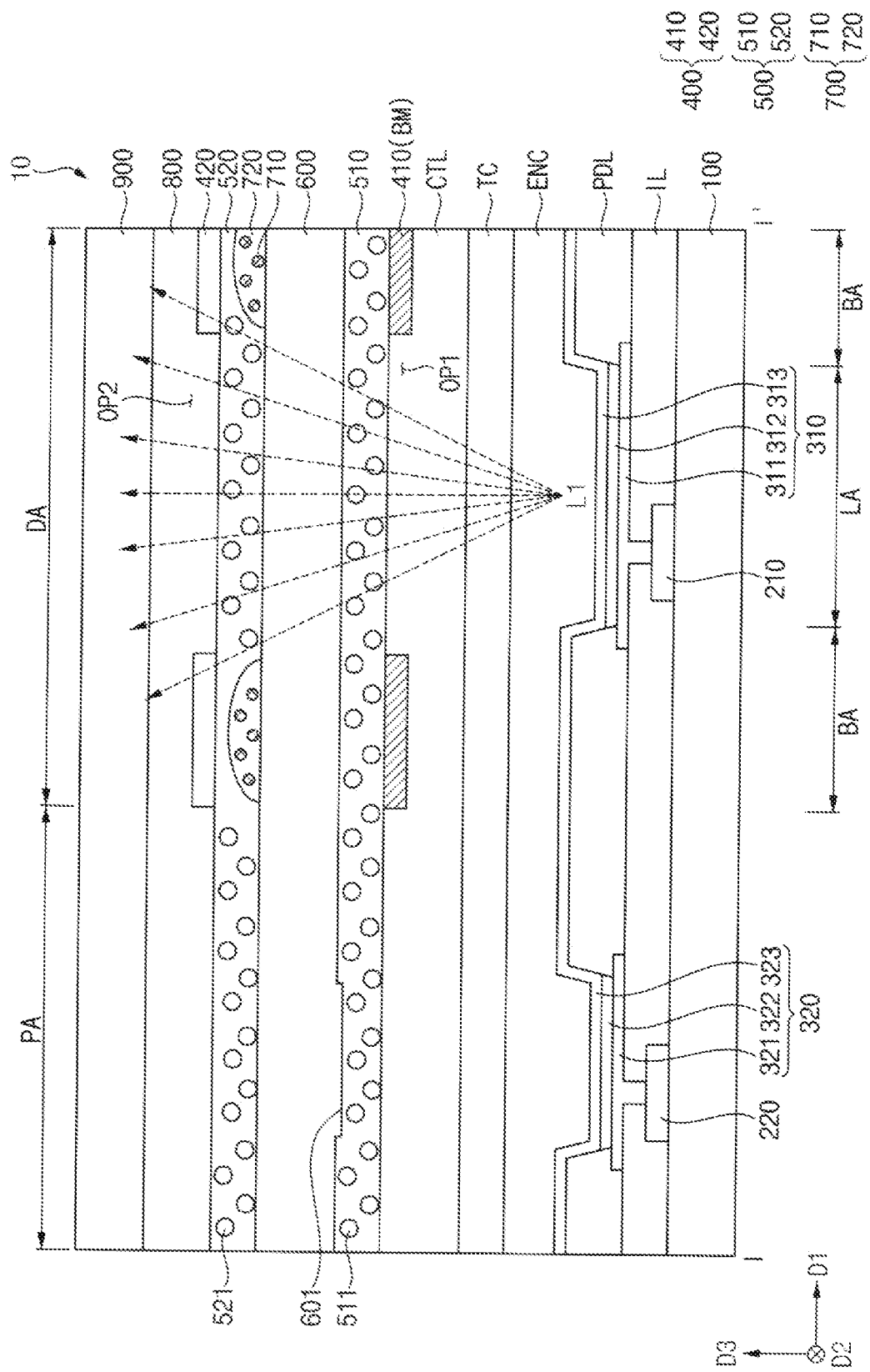

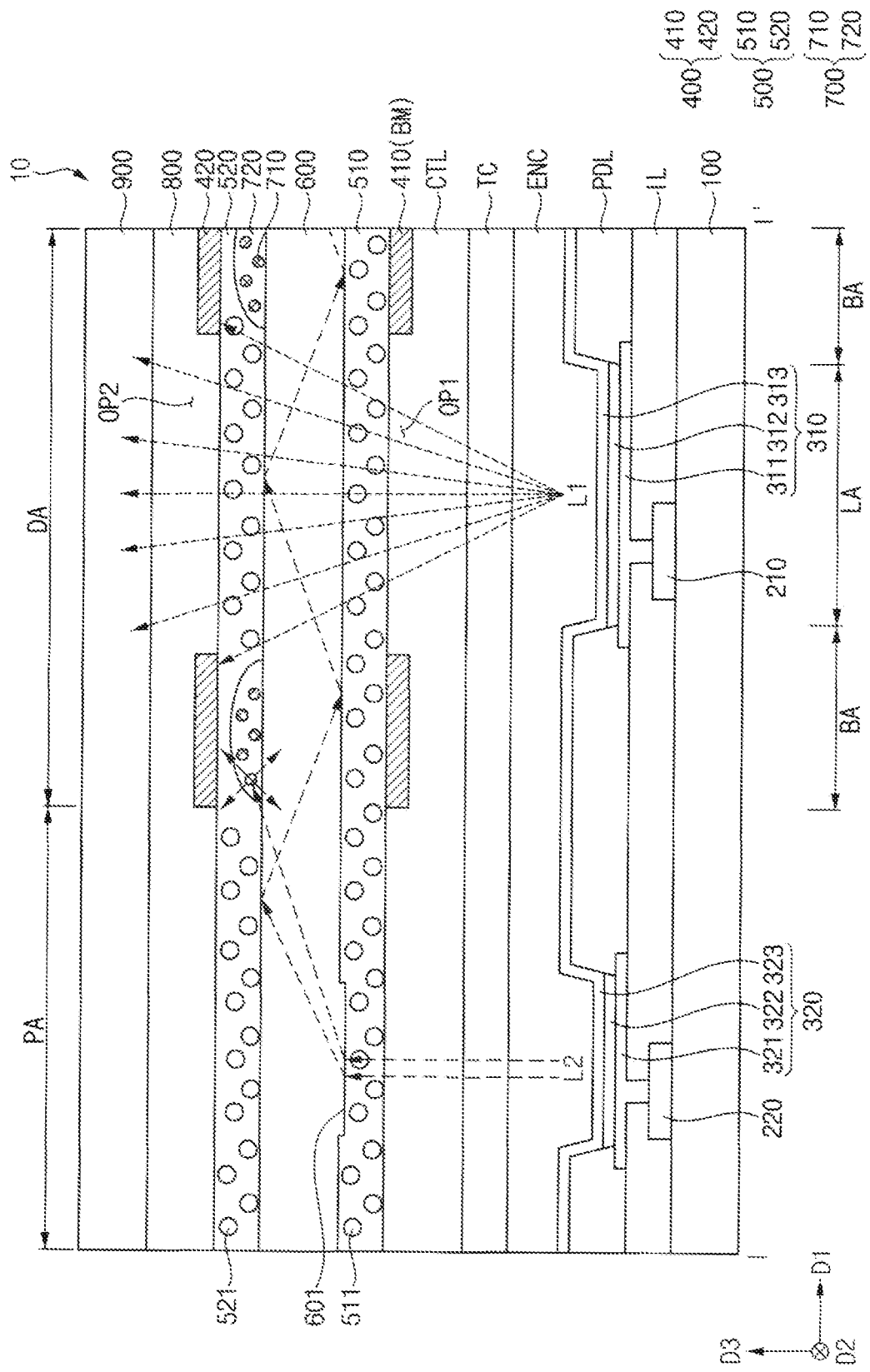

FIG. 4A
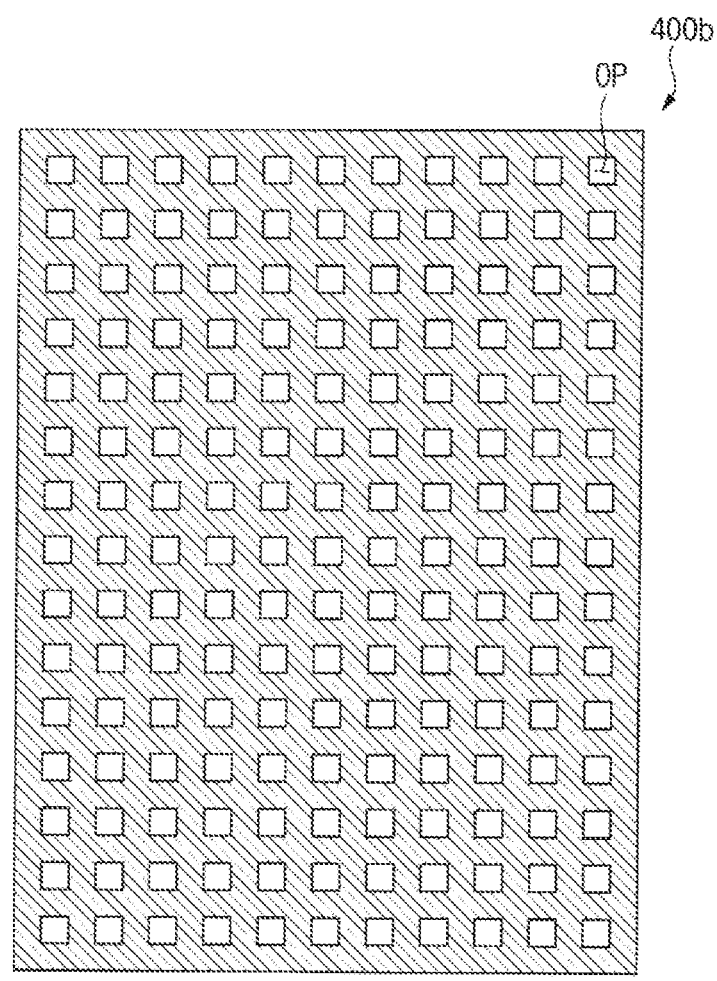
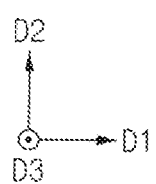

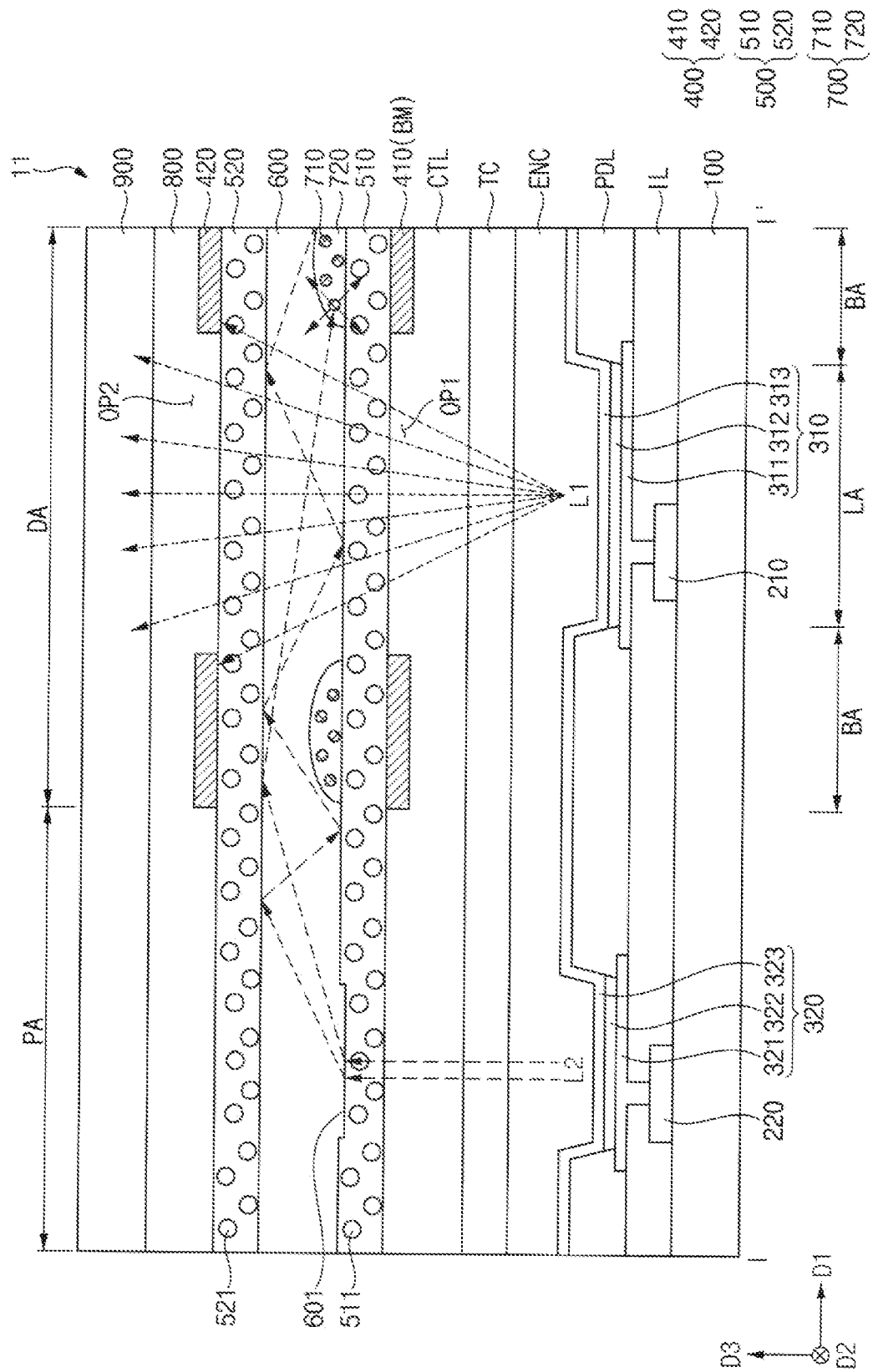

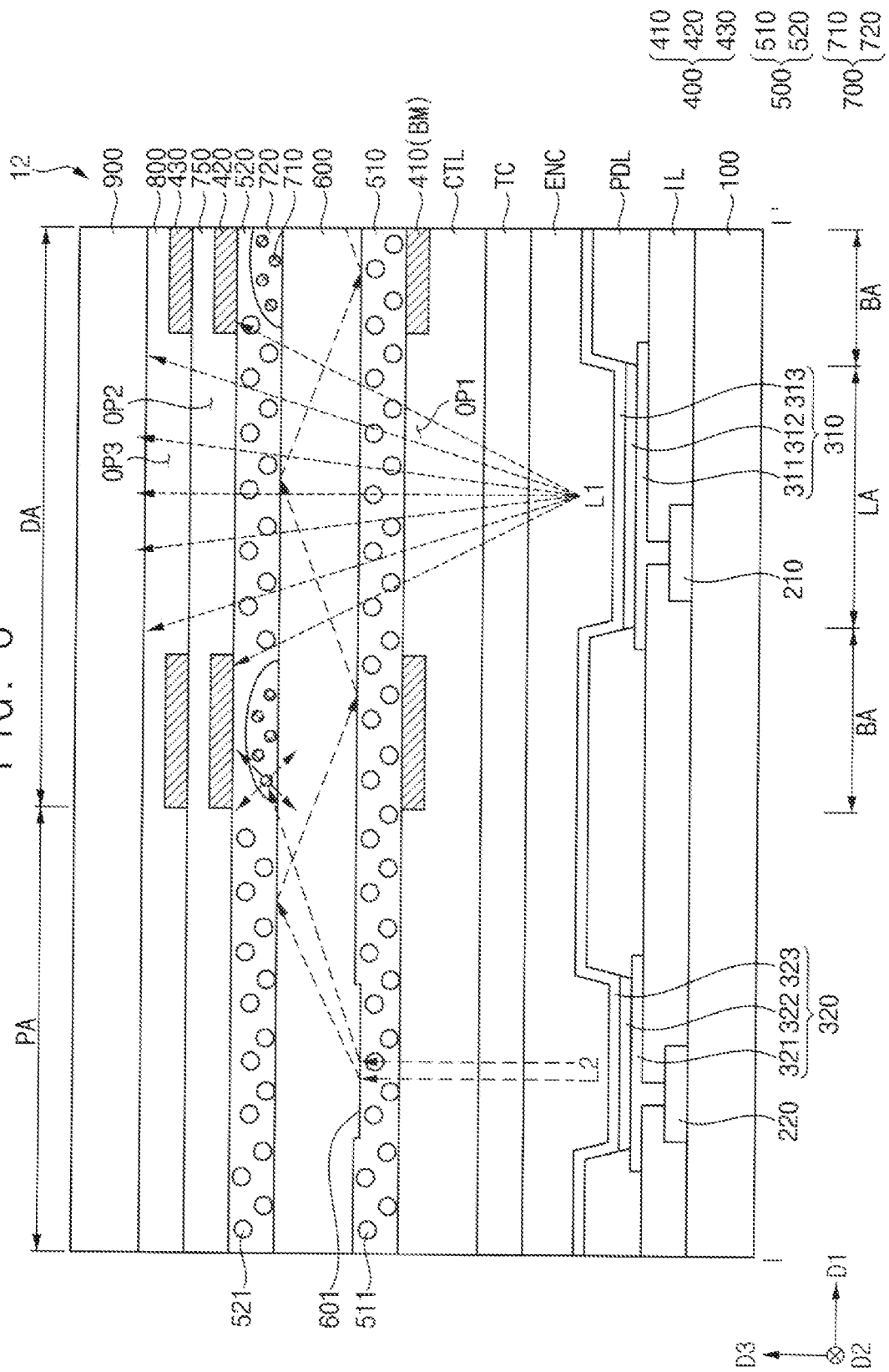

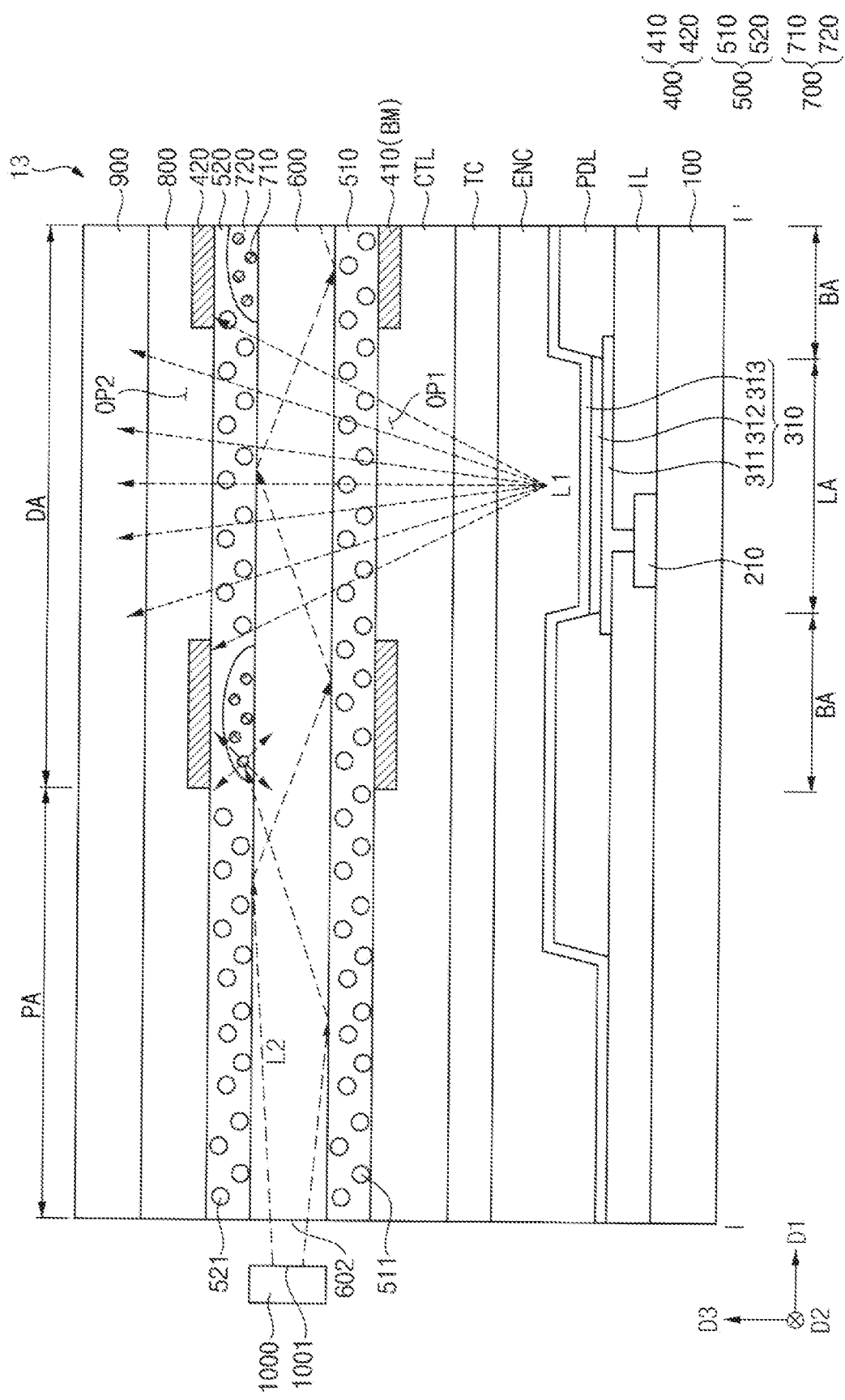

ANTI-PEEPING DISPLAY DEVICE

CROSS-REFERENCE TO RELATED APPLICATION

This application claims priority to and the benefit of Korean Patent Application No. 10-2021-0134936, filed on Oct. 12, 2021, which is hereby incorporated by reference for all purposes as if fully set forth herein.

BACKGROUND

1. Field

Embodiments relates generally to a display device. More particularly, embodiments relate to the display device that provides visual information.

2. Description of the Related Art

A flat panel display device is being used as a display device that replaces a cathode ray tube display due to characteristics such as light weight and thinness. Representative examples of such flat panel display devices include a liquid crystal display device and an organic light emitting display device.

In general, a display device is manufactured to implement a wide viewing angle. However, a display device with a narrow viewing angle may be required so that no one other than the user can see a screen in a public place.

SUMMARY

Embodiment provides a display device in which a viewing angle may be adjusted.

A display device according to an embodiment may include a substrate including a display area including a light emitting area and a light blocking area, and a peripheral area surrounding at least a portion of the display area, a first light emitting element disposed in the light emitting area on the substrate and emitting a first light, a light guide layer disposed on the first light emitting element to cover the display area and the peripheral area, and transmitting a second light incident from the peripheral area to the display area, a first low refractive layer disposed on the light guide layer and having a refractive index smaller than a refractive index of the light guide layer, a second low refractive layer disposed under the light guide layer and having a refractive index smaller than a refractive index of the light guide layer and a first light control layer disposed on the first low refractive layer and having a first opening exposing the light emitting area.

According to an embodiment, the display device may further include a second light control layer disposed under the second low refractive layer and having a second opening exposing the light emitting area.

According to an embodiment, each of the first light control layer and the second light control layer may include a photochromic material that is discolored by the second light.

According to an embodiment, the first light control layer may directly contact the first low refractive layer. The second light control layer may directly contact the second low refractive layer.

According to an embodiment, the first opening and the second opening may overlap with each other. The first light emitting element may overlap the first opening and the second opening, respectively.

According to an embodiment, the display device may further include a third light control layer disposed on the first light control layer, having a third opening exposing the light emitting area, and including a photochromic material that is discolored by the second light.

According to an embodiment, the display device may further include an insulating layer disposed between the first light control layer and the third light control layer, and covering the first light control layer.

According to an embodiment, the display device may further include a plurality of scattering patterns disposed between the light guide layer and the first low refractive layer. Each of the scattering patterns may overlap the first light control layer.

According to an embodiment, each of the scattering patterns may include an insulating film and a plurality of scattering particles dispersed in the insulating film.

According to an embodiment, a width of each of the scattering patterns may be smaller than a width of the first light control layer.

According to an embodiment, each of the first low refractive layer and the second low refractive layer may include a plurality of air bubbles disposed therein.

According to an embodiment, a refractive index of each of the first low refractive layer and the second low refractive layer may be smaller than a refractive index of the light guide layer by about 0.2 or more.

According to an embodiment, the display device may further include a second light emitting element disposed in the peripheral area on the substrate and emitting the second light.

According to an embodiment, the display device may further include a second light emitting element disposed to face a side surface of the light guide layer and emitting the second light.

According to an embodiment, the first light may be visible light. The second light may be infrared or ultraviolet light.

A display device according to an embodiment may include a substrate including a display area including a light emitting area and a light blocking area, and a peripheral area surrounding at least a portion of the display area, a first light emitting element disposed in the light emitting area on the substrate and emitting a first light, a light guide layer disposed on the first light emitting element to cover the display area and the peripheral area, and transmitting a second light incident from the peripheral area to the display area, a light control layer disposed in the display area on the first light emitting element, having an opening exposing the light emitting area, and disposed to be spaced apart from the light guide layer and a low refractive layer disposed between the light guide layer and the light control layer, and having a refractive index smaller than a refractive index of the light guide layer.

According to an embodiment, the low refractive layer may include a first low refractive layer disposed on the light guide layer and a second low refractive layer disposed under the light guide layer.

According to an embodiment, each of the first low refractive layer and the second low refractive layer may include a plurality of air bubbles disposed therein.

According to an embodiment, the light control layer may include a first light control layer disposed on the first low refractive layer and a second light control layer disposed under the second low refractive layer.

According to an embodiment, the display device may further include a plurality of scattering patterns disposed between the light guide layer and the first low refractive layer, each of the scattering patterns overlapping the first light control layer.

In a display device according to an embodiment of the present inventive concept, the display device may display an image in a first mode state implemented with a wide viewing angle or a second mode state implemented with a narrow viewing angle. A first low refractive layer having a refractive index smaller than a refractive index of the light guide layer may be disposed under the light guide layer, and a second low refractive layer having a refractive index smaller than a refractive index of the light guide layer may be disposed on the light guide layer. In addition, a first light control layer including a photochromic material that is discolored by light having a specific wavelength range may be disposed under the first low refractive layer, and a second light control layer including a photochromic material that is discolored by light having a specific wavelength range may be disposed on the second low refractive layer. Accordingly, when the display device is in the second mode state, the light of a specific wavelength range incident into the light guide layer in a peripheral area may be uniformly transmitted over an entire display area by total reflection.

BRIEF DESCRIPTION OF THE DRAWINGS

Illustrative, non-limiting embodiments will be more clearly understood from the following detailed description in conjunction with the accompanying drawings.

FIGS. 2A and 2B are cross-sectional views taken along line I-I' of FIG. 1.

FIGS. 4A and 4B are plan views illustrating another example of a light control layer of FIG. 2A.

FIG. 5 is a cross-sectional view illustrating a display device according to another embodiment.

FIG. 6 is a cross-sectional view illustrating a display device according to still another embodiment.

FIGS. 7A and 7B are a cross-sectional view illustrating a display device according to still another embodiment.

DETAILED DESCRIPTION OF THE EMBODIMENTS

Figure 1:
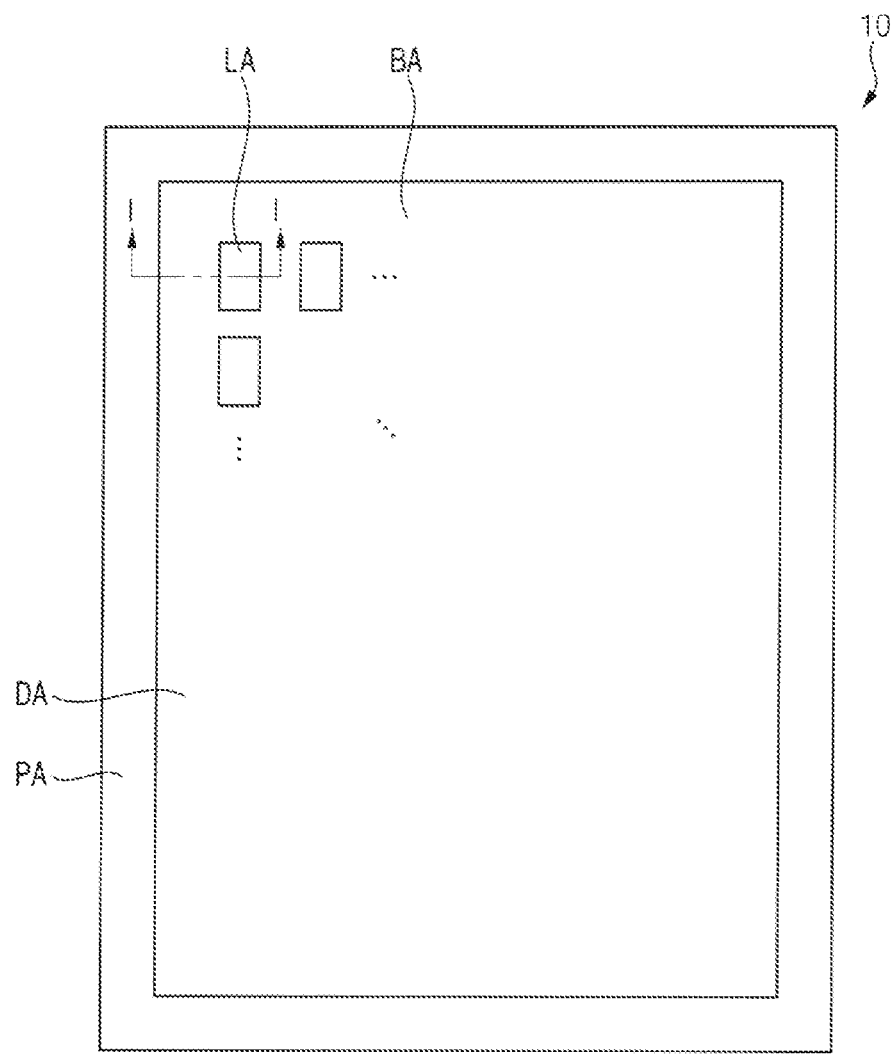
FIG. 1 is a plan view illustrating a display device according to an embodiment.

Hereinafter, embodiments of the present disclosure will be explained in detail with reference to the accompanying drawings. The same reference numerals are used for the same components in the drawings, and redundant descriptions of the same components will be omitted.

FIG. 1 is a plan view illustrating a display device according to an embodiment.

Referring to FIG. 1, the display device 10 according to an embodiment may include a display area DA and a peripheral area PA. A plurality of pixels may be disposed in the display area DA. An image may be displayed through the pixels in the display area DA. An image may not be displayed in the peripheral area PA. The peripheral area PA may be located outside the display area DA. For example, the peripheral area PA may surround the display area DA in a plan view.

The display area DA may include a plurality of light emitting areas LA and a light blocking area BA. Each of the pixels may be disposed in each of the light emitting areas LA. For example, the light emitting areas LA may be arranged in a matrix form along a first direction D1 and a second direction D2 intersecting the first direction D1. The first direction D1 may be perpendicular to the second direction D2. The light blocking area BA may surround the light emitting areas LA in a plan view.

A first light emitting element (e.g., the first light emitting element 310 of FIG. 2A) may be disposed in each of the light emitting areas LA. The first light emitting element may emit a first light having a first wavelength range. The first light may be visible light. For example, each of the light emitting areas LA may emit any one of red light, green light, and blue light. Specifically, the light emitting areas LA may include a first light emitting area from which the red light is emitted, a second light emitting area from which the green light is emitted, and a third light emitting area from which the blue light is emitted.

A light blocking layer may be disposed in the light blocking area BA. In an embodiment, the light blocking layer may be a black matrix. The light blocking layer may prevent the first lights (e.g., red light, green light, and blue light) emitted from the light emitting areas LA from being mixed with each other.

A second light emitting element (e.g., the second light emitting element 320 of FIG. 2A) may be disposed in the peripheral area PA. Alternatively, the second light emitting element may be disposed in the display area DA. The second light emitting element may emit a second light having a second wavelength range different from the first wavelength range. The second light may be ultraviolet or infrared light. For example, a viewing angle of the display device 10 may be adjusted by the second light. A detailed description thereof will be provided later. In an embodiment, the number of the second light emitting element may be plural.

However, although the display device 10 of the present inventive concept is limited to an organic light emitting display device ("OLED"), the configuration of the present inventive concept is not limited thereto. In other embodiments, the display device 10 may include a liquid crystal display device ("LCD"), a field emission display device ("FED"), a plasma display device ("PDP"), an electrophoretic display device ("EPD"), an inorganic light emitting display device ("ILED"), or a quantum dot display device. Hereinafter, an example in which the display device 10 of the present inventive concept includes the organic light emitting display device will be described.

FIGS. 2A and 2B are cross-sectional views taken along line I-I' of FIG. 1. For example, FIG. 2A may illustrate the display device 10 in a first mode state and FIG. 2B may illustrate the display device 10 in a second mode state. Here, the first mode state may be a mode for implementing a wide viewing angle and the second mode state may be a mode for implementing a narrow viewing angle.

Referring to FIGS. 1, 2A, and 2B, the display device 10 according to an embodiment may include a first substrate 100, an insulating structure IL, a first driving element 210, a first light emitting element 310, a second driving element 220, a second light emitting element 320, a pixel defining layer PDL, an encapsulation layer ENC, a touch sensing layer TC, a light collection layer CTL, a light control layer 400, a low refractive layer 500, a light guide layer 600, scattering patterns 700, a light absorption layer 800, and a second substrate 900.

As described above, the display device 10 may include the display area DA and the peripheral area PA. As the display device 10 includes the display area DA and the peripheral area PA, the first substrate 100 may also include the display area DA and the peripheral area PA.

The first substrate 100 may include a transparent material or an opaque material. For example, the first substrate 100 may be a transparent insulating substrate. Examples of the material that can be used for the first substrate 100 may be glass, quartz, plastic, and the like.

The first driving element 210 may be disposed in the display area DA on the first substrate 100. In addition, the second driving element 220 may be disposed in the peripheral area PA on the first substrate 100. In an embodiment, a semiconductor layer of each of the first driving element 210 and the second driving element 220 may include amorphous silicon, polycrystalline silicon, or a metal oxide semiconductor. Examples of materials that can be used for the metal oxide semiconductor may be indium (In), gallium (Ga), tin (Sn), zirconium (Zr), vanadium (V), hafnium ("Hf"), cadmium (Cd), germanium (Ge), chromium (Cr), titanium (Ti), zinc (Zn), or the like. These may be used alone or in combination with each other.

The insulating structure IL may be disposed on the first driving element 210 and the second driving element 220. The insulating structure IL may cover the first driving element 210 and the second driving element 220. For example, the insulating structure IL may include an inorganic insulating layer, an organic insulating layer, or the like. These may be used alone or in combination with each other.

A first lower electrode 311 may be disposed in the display area DA on the insulating structure IL. Specifically, the first lower electrode 311 may be disposed in the light emitting area LA on the insulating structure IL. In addition, the second lower electrode 321 may be disposed in the peripheral area PA on the insulating structure IL. The first lower electrode 311 may be electrically connected to the first driving element 210. The second lower electrode 321 may be electrically connected to the second driving element 220. For example, each of the first lower electrode 311 and the second lower electrode 321 may include a metal, an alloy, a conductive metal oxide, a conductive metal nitride, a transparent conductive material, or the like. These may be used alone or in combination with each other.

The pixel defining layer PDL may be disposed on the insulating structure IL on the first lower electrode 311 and the second lower electrode 321. The pixel defining layer PDL may have openings exposing at least a portion of each of the first lower electrode 311 and the second lower electrode 321. For example, the first opening may expose a central portion of the first lower electrode 311. The second opening may expose a central portion of the second lower electrode 321. The pixel defining layer PDL may cover a peripheral portion of each of the first lower electrode 311 and the second lower electrode 321. For example, the pixel defining layer PDL may include an organic insulating material.

A first light emitting layer 312 may be disposed on the first lower electrode 311 exposed by the first opening. That is, the first light emitting layer 312 may be disposed in the first opening. The first light emitting layer 312 may include an organic light emitting material emitting the first light L1 having the first wavelength range.

A second light emitting layer 322 may be disposed on the second lower electrode 321 exposed by the second opening. That is, the second light emitting layer 322 may be disposed in the second opening. The second light emitting layer 322 may include an organic light emitting material emitting the second light L2 having the second wavelength range.

A first upper electrode 313 may be disposed on the first light emitting layer 312 and a second upper electrode 323 may be disposed on the second light emitting layer 322. In an embodiment, the first upper electrode 313 and the second upper electrode 323 may be integrally formed. In this case, the first upper electrode 313 and the second upper electrode 323 may be entirely disposed in the display area DA and the peripheral area PA. In another embodiment, the first upper electrode 313 and the second upper electrode 323 may be separated. For example, each of the first upper electrode 313 and the second upper electrode 323 may include a metal, an alloy, a conductive metal oxide, a conductive metal nitride, a transparent conductive material, or the like. These may be used alone or in combination with each other.

Accordingly, the first light emitting element 310 including the first lower electrode 311, the first light emitting layer 312, and the first upper electrode 313 may be disposed in the display area DA on the first substrate 100. The second light emitting element 320 including the second lower electrode 321, the second light emitting layer 322, and the second upper electrode 323 may be disposed in the peripheral area PA of the first substrate 100.

The first light emitting element 310 may emit the first light L1 having the first wavelength range. The first light L1 may be visible light. For example, the first light L1 may be any one of red light, green light, and blue light.

The second light emitting element 320 may be formed using some of dummy pixels formed in the peripheral area PA during a manufacturing process of the display device 10. The second light emitting element 320 may emit the second light L2 having the second wavelength range. For example, the second light L2 may include various types of light (e.g., ultraviolet light, infrared light, visible light, and the like) having a different wavelength range from the first wavelength range. Hereinafter, a case in which the second light L2 is ultraviolet light will be described as an example.

The first light emitting element 310 may be driven by the first driving element 210 and the second light emitting element 320 may be driven by the second driving element 220. That is, the second light emitting element 320 emitting the second light L2 may be driven independently of the first light emitting element 310 emitting the first light L1. For example, the second driving element 220 may not drive the second light emitting element 320 when the display device 10 is in the first mode state. The second driving element 220 may drive the second light emitting element 320 when the display device 10 is in the second mode state.

The encapsulation layer ENC may be disposed on the first upper electrode 313 and the second upper electrode 323. Specifically, the encapsulation layer ENC may be entirely cover the display area DA and the peripheral area PA. The encapsulation layer ENC may cover the first light emitting element 310 and the second light emitting element 320, and may protect the first light emitting element 310 and the second light emitting element 320 from external impurities.

The encapsulation layer ENC may include at least one inorganic encapsulation layer and at least one organic encapsulation layer. For example, the encapsulation layer ENC may include a first inorganic encapsulation layer, an organic encapsulation layer disposed on the first inorganic encapsulation layer, and a second inorganic encapsulation layer disposed on the organic encapsulation layer.

The touch sensing layer TC may be disposed on the encapsulation layer ENC. The touch sensing layer TC may sense a user's contact or non-contact touch. For example, the touch sensing layer TC may sense a user's touch in a capacitive manner. For example, the touch sensing layer TC may sense a user's touch using a self-capacitance method or a mutual capacitance method. Alternatively, the touch sensing layer TC may be omitted.

The light collection layer CTL may be disposed on the touch sensing layer TC. For example, the light collection layer CTL may include a plurality of micro lenses. Accordingly, a light path of the first light L1 emitted from the first light emitting element 310 may be focused toward a third direction D3 intersecting the first direction D1 and the second direction D2. The third direction D3 may be perpendicular to the first direction D1 and the second direction D2. Alternatively, the light collection layer CTL may be omitted.

The light guide layer 600 may be disposed on the encapsulation layer ENC. Specifically, the light guide layer 600 may be entirely cover the display area DA and the peripheral area PA.

For example, as shown in FIG. 2B, when the display device 10 is in the second mode state, the second light L2 emitted from the second light emitting element 320 may be incident to a portion of the light guide layer 600 overlapping the peripheral area PA. The light guide layer 600 may transmit the second light L2 incident from the peripheral area PA to the display area DA.

The second light L2 incident into the light guide layer 600 in the peripheral area PA may be transmitted to the display area DA by total reflection. In an embodiment, a refractive index of the light guide layer 600 may be greater than a refractive index of layers (e.g., the low refractive layer 500) in contact with the upper and lower portions of the light guide layer 600. Accordingly, the second light L2 incident into the light guide layer 600 in the peripheral area PA may be transmitted to the display area DA by total reflection.

The light guide layer 600 may include an optical pattern 601. In an embodiment, the optical pattern 601 may be formed on a lower surface of the light guide layer 600 overlapping the peripheral area PA. Specifically, the optical pattern 601 may have a structure protruding from the light guide layer 600 toward the encapsulation layer ENC. The optical pattern 601 may refract the second light L2 so that the second light L2 incident to the light guide layer 600 in the peripheral area PA is totally reflected into the light guide layer 600. That is, as shown in FIG. 2B, the second light L2 emitted from the second light emitting element 320 may be refracted toward the display area DA (i.e., in the first direction D1) by the optical pattern 601.

The optical pattern 601 may be implemented as a diffraction optical element, a hologram optical element, a micro pattern, or the like.

The low refractive layer 500 may be disposed on the encapsulation layer ENC. The low refractive layer 500 may be entirely disposed in the display area DA and the peripheral area PA. Specifically, the low refractive layer 500 may be disposed between the light guide layer 600 and the light control layer 400. In an embodiment, the low refractive layer 500 may include a first low refractive layer 510 disposed under the light guide layer 600 and a second low refractive layer 520 disposed on the light guide layer 600. That is, the first low refractive layer 510 and the second low refractive layer 520 may be spaced apart from each other in the third direction D3 with the light guide layer 600 disposed therebetween.

In an embodiment, the first low refractive layer 510 may contact a lower surface of the light guide layer 600 and the second low refractive layer 520 may contact an upper surface of the light guide layer 600.

The first low refractive layer 510 may provide a substantially flat lower surface, and the second low refractive layer 520 may provide a substantially flat upper surface. Each of the first low refractive layer 510 and the second low refractive layer 520 may include an organic insulating material. In an embodiment, each of the first low refractive layer 510 and the second low refractive layer 520 may further include a plurality of air bubbles 511 and 521 disposed therein.

A refractive index of each of the first low refractive layer 510 and the second low refractive layer 520 may be smaller than a refractive index of the light guide layer 600. In an embodiment, the refractive index of each of the first low refractive layer 510 and the second low refractive layer 520 may be smaller than the refractive index of the light guide layer 600 by about 0.2 or more. For example, the refractive index of each of the first low refractive layer 510 and the second low refractive layer 520 may be about 1.2, and the refractive index of the light guide layer 600 may be about 1.5. Accordingly, the second light L2 incident into the light guide layer 600 in the peripheral area PA may be uniformly transmitted over the entire display area DA by total reflection at the interface between the light guide layer 600 and the low refractive layer 500 that includes the first low refractive layer 510 and the second low refractive layer 520.

The light control layer 400 may include a light blocking layer BM. The light blocking layer BM may be disposed in the display area DA on the encapsulation layer ENC. Specifically, the light blocking layer BM may be disposed in the light blocking area BA of the display area DA. The light blocking layer BM may be a black matrix. For example, the light blocking layer BM may include a light blocking material. The light blocking layer BM may prevent the visible light of different colors from being mixed or affecting each other. In an embodiment, the light blocking layer BM may be disposed under the first low refractive layer 510.

The light control layer 400 may be disposed in the display area DA on the encapsulation layer ENC. That is, the light control layer 400 may be disposed on the first light emitting element 310. Specifically, the light control layer 400 may be disposed in an area corresponding to the light blocking area BA of the display area DA. The light control layer 400 may have openings OP1 and OP2 exposing the light emitting area LA. In addition, the light control layer 400 may be disposed to be spaced apart from the light guide layer 600 in the third direction D3.

In an embodiment, the light control layer 400 may include a first light control layer 410 disposed under the first low refractive layer 510 and a second light control layer 420 disposed on the second low refractive layer 520. That is, the first light control layer 410 and the second light control layer 420 may be spaced apart from each other in the third direction D3. In other words, the light control layer 400 may include two layers. Specifically, the first light control layer 410 may be the light blocking layer BM described herein above.

The first light control layer 410 may have a first opening OP1 exposing the light emitting area LA and the second light control layer 420 may have a second opening OP2 exposing the light emitting area LA. The first opening OP1 and the second opening OP2 may overlap with each other. In addition, the first light emitting element 310 may overlap the first opening OP1 and the second opening OP2, respectively. That is, each of the first opening OP1 and the second opening OP2 may overlap the light emitting area LA. For example, each of the first light control layer 410 and the second light control layer 420 may not overlap the light emitting area LA.

Each of the first light control layer 410 and the second light control layer 420 may include a photochromic material that changes colors when exposed to light having a specific wavelength range. For example, the photochromic material may include spiropyran, diarylethene, azobenzene, or the like. These may be used alone or in combination with each other. However, it is illustrative, and the present inventive concept is not limited thereto.

The photochromic material may be discolored by the second light L2 (e.g., ultraviolet light) having the second wavelength range. The photochromic material may not be discolored by the first light L1 (e.g., visible light) having the first wavelength range. In addition, the photochromic material may transmit the first light L1 in a state in which the photochromic material is not discolored by the second light L2. The photochromic material may absorb the first light L1 and block the first light L1 when it is discolored by the second light L2. For example, the photochromic material may have a transmittance of about 30% or less with respect to the first light L1 when it is discolored by the second light L2.

The plurality of scattering patterns 700 may be disposed on the light guide layer 600. Specifically, the scattering patterns 700 may be disposed between the light guide layer 600 and the second low refractive layer 520. In an embodiment, each of the scattering patterns 700 may contact the upper surface of the light guide layer 600. The second low refractive layer 520 may cover the scattering patterns 700. In addition, each of the scattering patterns 700 may overlap the first light control layer 410 and the second light control layer 420. That is, the scattering patterns 700 may be disposed to be spaced apart from each other at a predetermined interval along the first direction D1. For example, an upper surface of each of the scattering patterns 700 may have a convex shape in a cross-sectional view.

As shown in FIG. 2B, at least a portion of the second light L2 transmitted in the first direction D1 from the inside of the light guide layer 600 may proceed to the scattering patterns 700 disposed in the display area DA. A portion of the second light L2 traveled to the scattering patterns 700 may be scattered by the scattering patterns 700. Accordingly, a portion of the second light L2 may be emitted to outside of the light guide layer 600 (e.g., the light control layer 400) without being totally reflected into the light guide layer 600. Another portion of the second light L2 that is not emitted to the outside of the light guide layer 600 may be transmitted in the first direction D1 by total reflection at the interface between the light guide layer 600 and the low refractive layer 500 into the light guide layer 600.

Each of the scattering patterns 700 may include a plurality of scattering particles 710 dispersed in an insulating film 720. For example, each of the scattering particles 710 may include titanium oxide ($TiO_x$). For example, the insulating film 720 may include an organic insulating material.

In an embodiment, a width of each of the scattering patterns 700 in the first direction D1 and the second direction D2 may be smaller than a width of each of the first light control layer 410 and the second light control layer 420 in the first direction D1 and the second direction D2. Accordingly, an emission of a portion of the second light L2 scattered by the scattering patterns 700 to the outside of the display device 10 through the openings OP1 and OP2 of the light control layer 400 may be reduced.

Figure 3A:
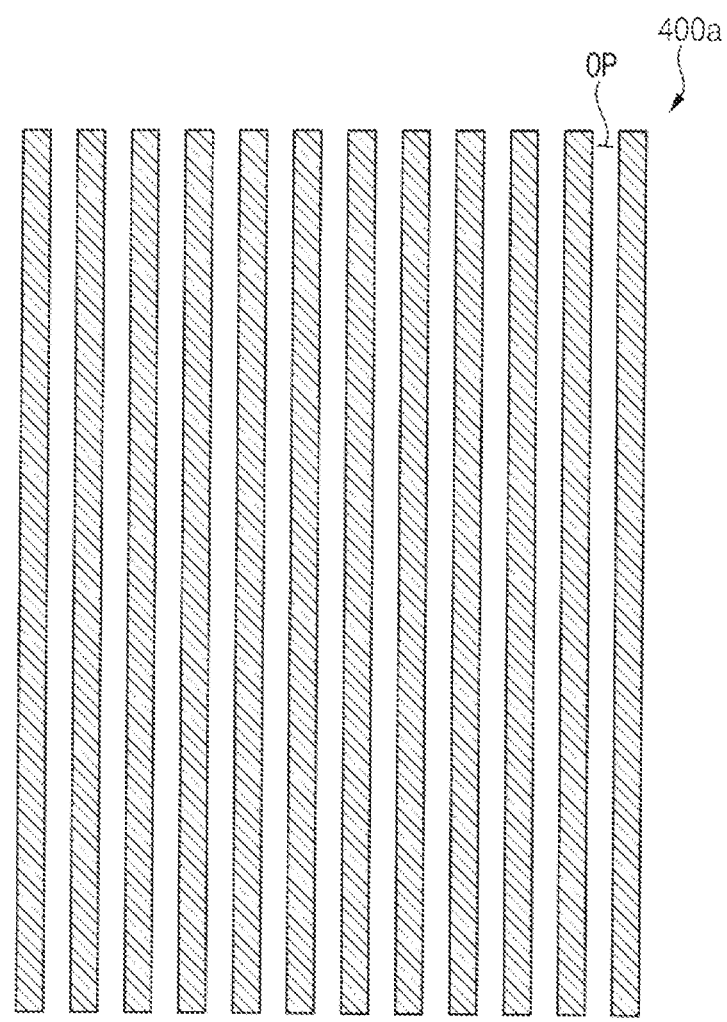
FIGS. 3A and 3B are plan views illustrating an example of a light control layer of FIG. 2A.
Figure 3B:
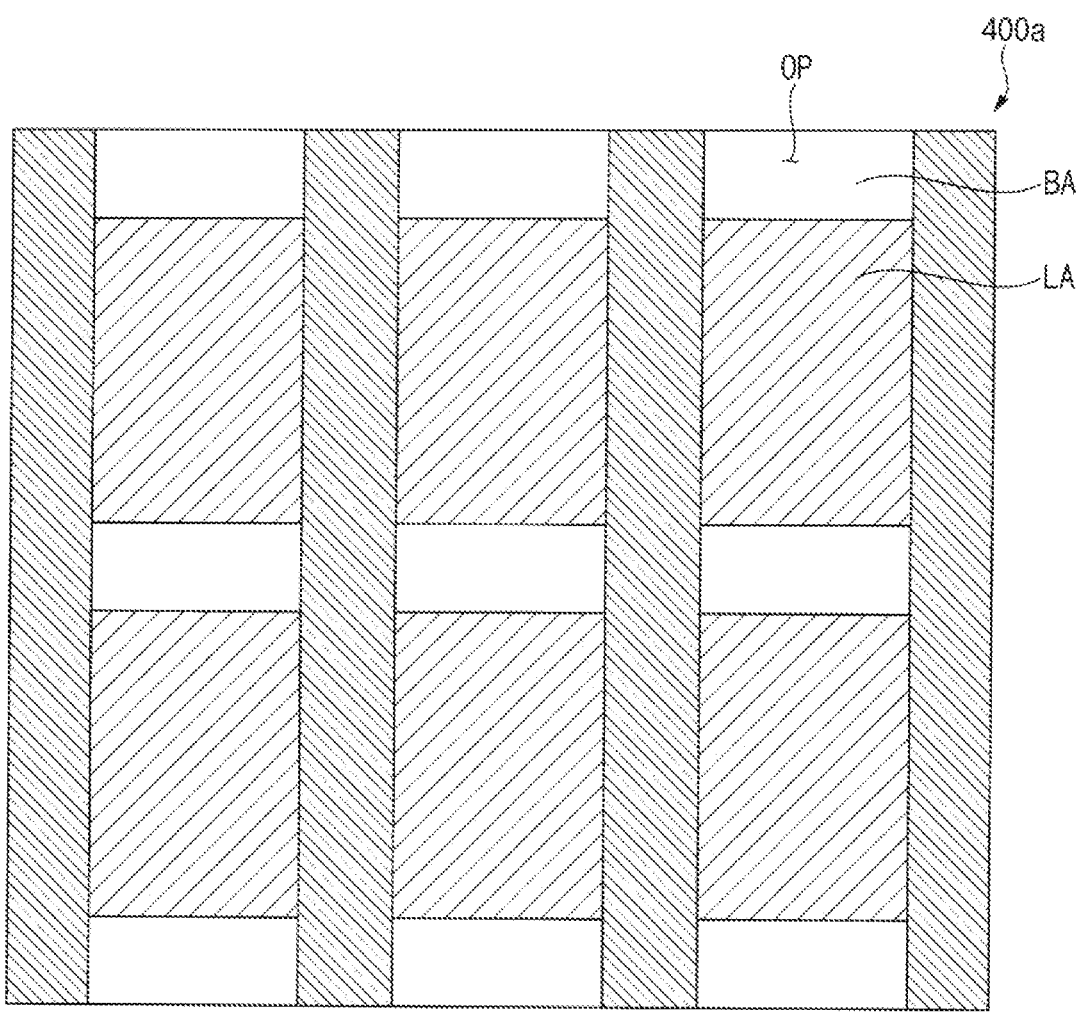

FIGS. 3A and 3B are plan views illustrating an example of a light control layer of FIG. 2A. For example, FIG. 3B may be an enlarged view of a partial area of the light control layer 400a illustrated in FIG. 3A.

Referring to FIGS. 1, 2A, 2B, 3A, and 3B, in an embodiment, the light control layer 400a may have a slit shape in the plan view. For example, the light control layer 400a may include a plurality of stripe patterns that extend in the second direction D2 and are arranged along the first direction D1. That is, the openings OP formed in the light control layer 400a may extend in the second direction D2 and may be arranged along the first direction D1.

Each of the openings OP may overlap the plurality of light emitting areas LA arranged in the second direction D2. In the second mode state, the viewing angle of the display device 10 in the first direction D1 may be reduced, but the viewing angle of the display device 10 in the second direction D2 may not be reduced. To reduce the viewing angle of the display device 10 in the second direction D2, the light control layer 400a may include a plurality of stripe patterns that extends in the first direction D1 and arranged along the second direction D2.

Figure 4B:
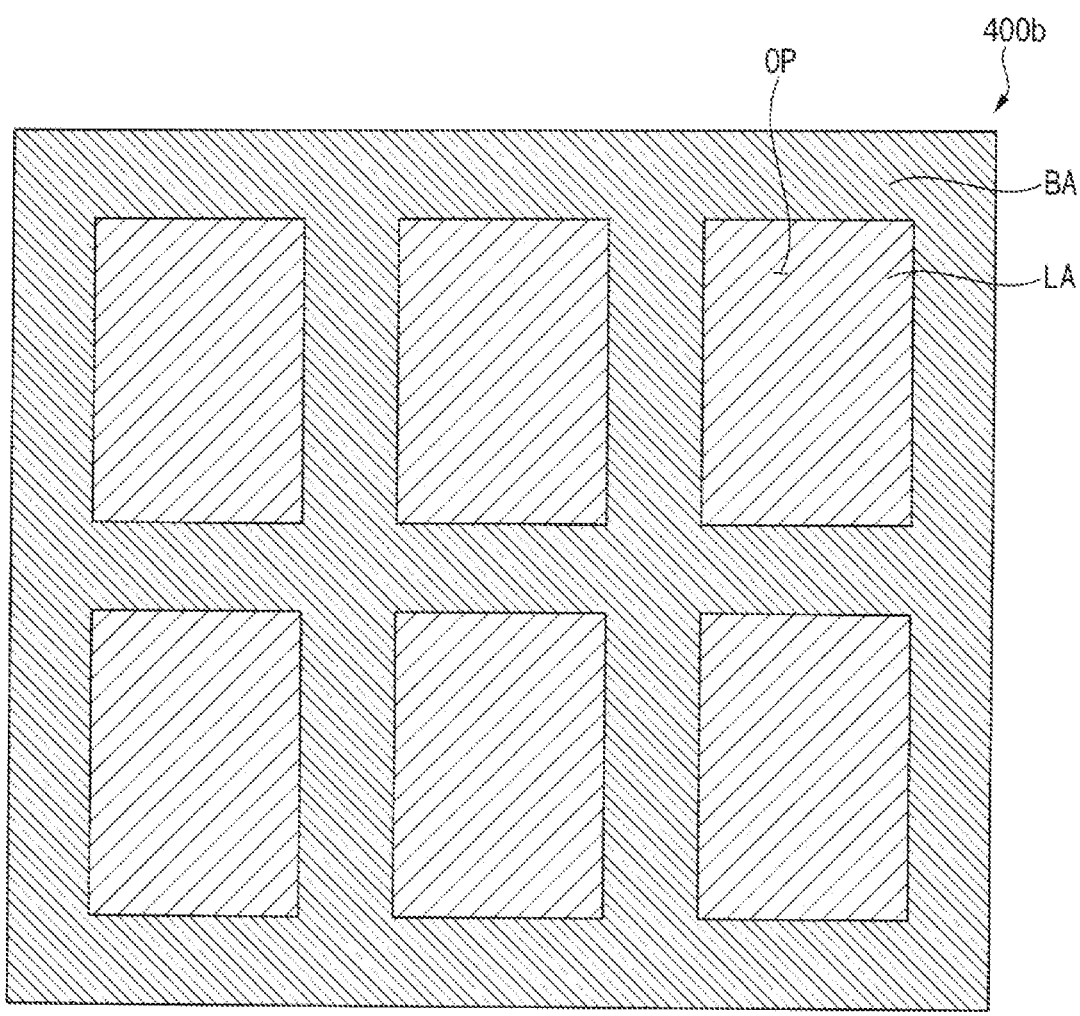

FIGS. 4A and 4B are plan views illustrating another example of a light control layer of FIG. 2A. For example, FIG. 4B may be an enlarged view of a partial area of the light control layer 400b illustrated in FIG. 4A.

Referring to FIGS. 1, 2A, 2B, 4A, and 4B, in an embodiment, the light control layer 400b may have a lattice shape in the plan view. In other words, the openings OP formed in the light control layer 400b may be arranged in a matrix shape along the first direction D1 and the second direction D2. Each of the openings OP may overlap each of the light emitting areas LA. For example, in a plan view, an area of each of the openings OP may be the same as an area of each of the light emitting areas LA. In the second mode state, both the viewing angle in the first direction D1 and the viewing angle in the second direction D2 of the display device 10 may be reduced.

Referring back to FIGS. 2A and 2B, the light absorption layer 800 may be disposed on the second light control layer 420. Specifically, the light absorption layer 800 may entirely cover the display area DA and the peripheral area PA. The light absorption layer 800 may selectively absorb the second light L2 having the second wavelength range. That is, the light absorption layer 800 may block the second light L2 from being emitted to the outside of the display device 10. In addition, the light absorption layer 800 may block light incident from the outside of the display device 10 having the second wavelength range (e.g., ultraviolet light). The light absorption layer 800 may transmit the first light L1 having the first wavelength range (e.g., visible light).

The second substrate 900 may include a transparent material. For example, the second substrate 900 may include glass, quartz, plastic, or the like. The second substrate 900 may transmit the first light L1 emitted from the first light emitting element 310.

Hereinafter, an operation of the display device 10 in the first mode state and the second mode state will be described with reference to FIGS. 2A and 2B.

When the display device 10 is in the first mode state illustrated in FIG. 2A, the first driving element 210 may drive the first light emitting element 310 and the second driving element 220 may not drive the second light emitting element 320. In this case, the first light L1 (e.g., visible light) may be emitted from the first light emitting element 310 and the light may not be emitted from the second light emitting element 320. Accordingly, the light control layer 400 may not be discolored. Accordingly, the light control layer 400 may transmit the first light L1. That is, the first light L1 emitted from the light emitting area LA may not be blocked by the light control layer 400, but may be emitted to the outside of the display device 10 through the second substrate 900. Accordingly, the display device 10 may have the wide viewing angle in the first mode state.

When the display device 10 is switched to the second mode state illustrated in FIG. 2B, the second driving element 220 may drive the second light emitting element 320. Accordingly, the second light L2 (e.g., ultraviolet light) may be emitted from the second light emitting element 320. As described above, the second light L2 emitted from the second light emitting element 320 may be transmitted to the display area DA through the light guide layer 600. In addition, a portion of the second light L2 transmitted from the light guide layer 600 may be emitted to the outside (e.g., the light control layer 400) of the light guide layer 600 by the scattering patterns 700. Accordingly, the light control layer 400, for example, the second light control layer 420, may be discolored. Accordingly, the first light L1 traveling toward the light control layer 400 among the first lights L1 emitted from the light emitting area LA may be blocked by the light control layer 400.

Among the first lights L1 emitted from the light emitting area LA, the first light L1 traveling toward the openings OP1 and OP2 may be not blocked by the light control layer 400 and may be emitted to the outside of the display device 10 through the second substrate 900. That is, when the display device 10 is in the second mode state, the light control layer 400 may block the first light L1 having an incident angle greater than or equal to a predetermined angle among the first lights L1 emitted from the light emitting area LA. Accordingly, the display device 10 may have the narrow viewing angle in the second mode state.

When the display device 10 is switched back to the first mode state, the second driving element 220 may not drive the second light emitting element 320. In this case, no light is emitted from the second light emitting element 320 and the color of the light control layer 400 may be restored to original state of the light control layer 400. Accordingly, the light control layer 400 may again transmit the first light L1 and the display device 10 may again have the wide viewing angle.

When the light control layer 400 including a photochromic material that is discolored by light having a specific wavelength range is disposed adjacent to or in direct contact with the light guide layer 600 that transmits the light incident on the peripheral area PA to the display area DA, the total reflection of the light incident on the peripheral area PA may not be occurred, and thus the light may not be uniformly transmitted to the entire display area DA.

In the display device 10 according to an embodiment of the present inventive concept, the first low refractive layer 510 having a refractive index smaller than a refractive index of the light guide layer 600 may be disposed under the light guide layer 600. The second low refractive layer 520 having a refractive index smaller than the refractive index of the light guide layer 600 may be disposed on the light guide layer 600. In addition, the first light control layer 410 including a photochromic material that is discolored by the second light L2 (e.g., ultraviolet light) may be disposed under the first low refractive layer 510. The second light control layer 420 including a photochromic material that is discolored by the second light L2 may be disposed on the second low refractive layer 520. In this case, a loss of the second light L2 that discolors the photochromic material may be reduced. Accordingly, the second light L2 incident into the light guide layer 600 from the peripheral area PA may be uniformly transmitted over the entire display area DA by total reflection at an interface between the light guide layer 600 and the low refractive layer 500.

FIG. 5 is a cross-sectional view illustrating a display device according to another embodiment.

Referring to FIG. 5, the display device 11 according to another embodiment of the present inventive concept includes the first substrate 100, the insulating structure IL, the first driving element 210, the first light emitting element 310, the second driving element 220, the second light emitting element 320, the pixel defining layer PDL, the encapsulation layer ENC, the touch sensing layer TC, the light collection layer CTL, the light control layer 400, the low refractive layer 500, the light guide layer 600, the scattering patterns 700, the light absorption layer 800, and the second substrate 900. The display device 11 described with reference to FIG. 5 may be substantially the same as or similar to the display device 10 described with reference to FIGS. 1, 2A, and 2B except for a position of the scattering patterns 700. Hereinafter, overlapping descriptions will be omitted.

The scattering patterns 700 may be disposed on the encapsulation layer ENC. Specifically, the scattering patterns 700 may be disposed on the first low refractive layer 510. In addition, each of the scattering patterns 700 may overlap the light control layer 400.

In an embodiment, each of the scattering patterns 700 may contact an upper surface of the first low refractive layer 510 and a lower surface of the light guide layer 600, respectively. That is, the light guide layer 600 may cover the scattering patterns 700.

According to another embodiment of the present inventive concept, the display device 11 may display an image in a first mode state implemented with the wide viewing angle or the second mode state implemented with the narrow viewing angle. Accordingly, the viewing angle of the display device 11 may be adjusted.

FIG. 6 is a cross-sectional view illustrating a display device according to still another embodiment.

Referring to FIG. 6, the display device 12 according to still another embodiment may include the first substrate 100, the insulating structure IL, the first driving element 210, the first light emitting element 310, the second driving element 220, the second light emitting element 320, the pixel defining layer PDL, the encapsulation layer ENC, the touch sensing layer TC, the light collection layer CTL, the light control layer 400, the low refractive layer 500, the light guide layer 600, the scattering patterns 700, an insulating layer 750, the light absorption layer 800, and the second substrate 900. The display device 12 described with reference to FIG. 6 may be substantially the same as or similar to the display device 10 described with reference to FIGS. 1, 2A, and 2B except that the display device 12 further includes a third light control layer 430 and the insulating layer 750. Hereinafter, overlapping descriptions will be omitted.

The light control layer 400 may be disposed in the display area DA on the encapsulation layer ENC. The light control layer 400 may have openings OP1, OP2, and OP3 exposing the light emitting area LA. In addition, the light control layer 400 may be spaced apart from the light guide layer 600 in the third direction D3.

As described above, the light control layer 400 may include the first light control layer 410 disposed under the first low refractive layer 510 and the second light control layer 420 disposed on the second low refractive layer 520. The first light control layer 410 may have the first opening OP1 exposing the light emitting area LA and the second light control layer 420 may have the second opening OP2 exposing the light emitting area LA.

In an embodiment, the light control layer 400 may further include a third light control layer 430 disposed on the second light control layer 420 with the insulating layer 750 disposed therebetween. The third light control layer 430 may have a third opening OP3 exposing the light emitting area LA.

The first to third openings OP1, OP2, and OP3 may overlap each other. In addition, each of the first to third openings OP1, OP2, and OP3 may overlap the light emitting area LA. For example, each of the first to third light control layers 410, 420, and 430 may not overlap the light emitting area LA.

Each of the first to third light control layers 410, 420, and 430 may include a photochromic material that is discolored by light having a specific wavelength range, for example, the second light L2 (e.g., ultraviolet light). For example, the photochromic material may include spiropyran, diarylethene, azobenzene, or the like. These may be used alone or in combination with each other.

The insulating layer 750 may be disposed on the second low refractive layer 520 on the second light control layer 420. The insulating layer 750 may entirely cover the display area DA and the peripheral area PA. Specifically, the insulating layer 750 may be disposed between the second light control layer 420 and the third light control layer 430. In addition, the insulating layer 750 may cover the second light control layer 420. For example, the insulating layer 750 may include an organic insulating material.

The light absorption layer 800 may be disposed on the insulating layer 750. The light absorption layer 800 may cover the third light control layer 430. The light absorption layer 800 may selectively absorb the second light L2 having the second wavelength range.

According to still another embodiment of the present inventive concept, the display device 12 may display an image in the first mode state implemented with the wide viewing angle or the second mode state implemented with the narrow viewing angle. Accordingly, the viewing angle of the display device 12 may be adjusted.

Figure 7A:
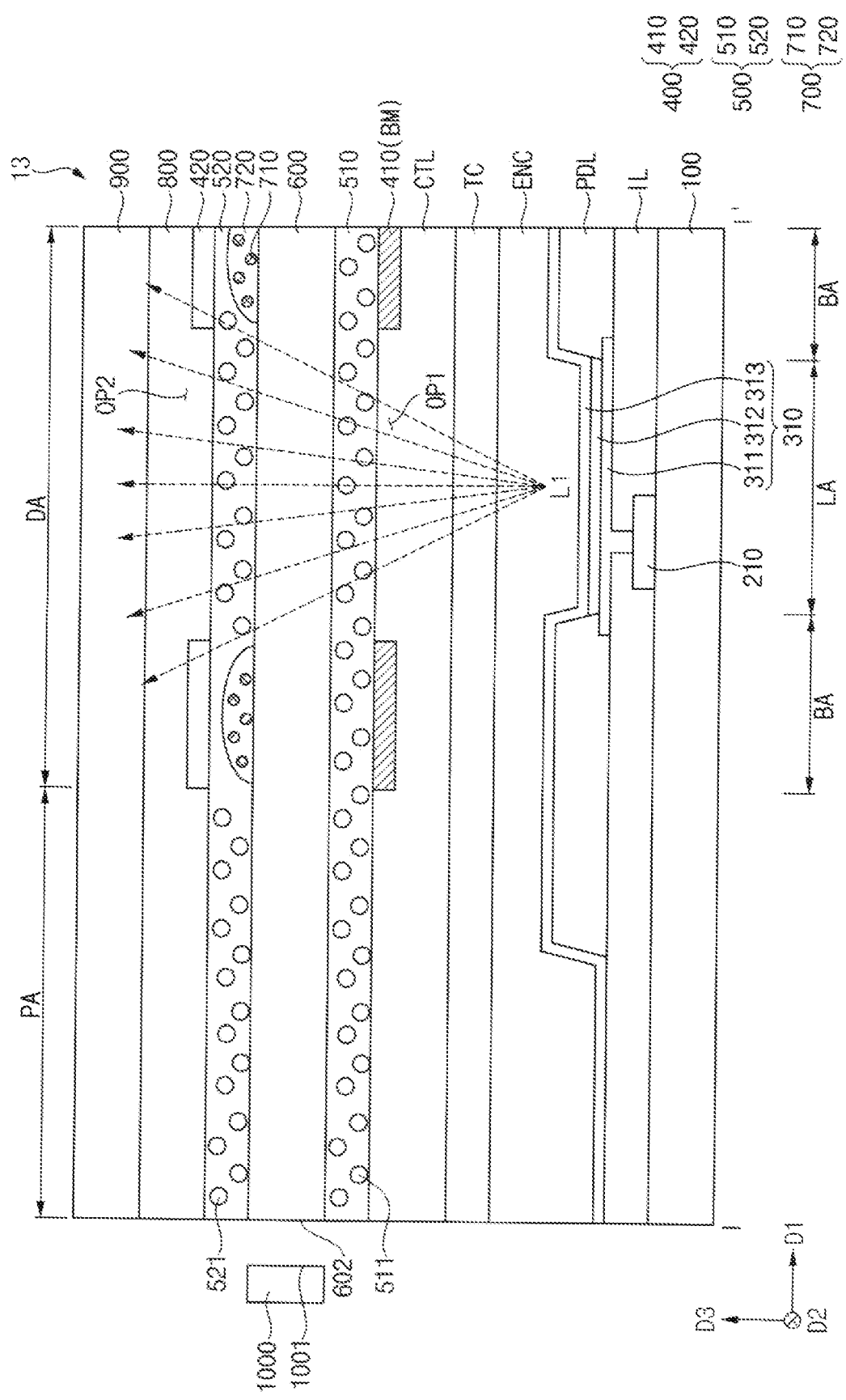

FIGS. 7A and 7B are a cross-sectional view illustrating a display device according to still another embodiment. For example, FIG. 7A may illustrate the display device 13 in a first mode state and FIG. 7B may illustrate the display device 13 in a second mode state. The first mode state may be a mode for implementing a wide viewing angle and the second mode state may mean a mode for implementing a narrow viewing angle mode.

Referring to FIGS. 7A and 7B, the display device 13 according to still another embodiment of the present inventive concept may include the first substrate 100, the insulating structure IL, the first driving element 210, the first light emitting element 310, a second light emitting element 1000, the pixel defining layer PDL, the encapsulation layer ENC, the touch sensing layer TC, the light collection layer CTL, the light control layer 400, the low refractive layer 500, the light guide layer 600, the scattering patterns 700, the light absorption layer 800, and the second substrate 900. The display device 13 described with reference to FIGS. 7A and 7B may be substantially the same or similar to the display device 10 described with reference to FIGS. 1, 2A and 2B except for a position of the second light emitting element 1000.

The first light emitting element 310 may be disposed in the display area DA on the first substrate 100. Specifically, the first light emitting element 310 may be disposed in the light emitting area LA on the first substrate 100. The first light emitting element 310 may emit the first light L1 having a first wavelength range. The first light L1 may be visible light.

In an embodiment, the second light emitting element 1000 may be disposed outside a display panel. Specifically, the second light emitting element 1000 may be disposed on at least one side of the display device 13. For example, the second light emitting element 1000 may be disposed on the side of the display device 13 to face the light guide layer 600. The light emitting surface 1001 of the second light emitting element 1000 may face one side 602 of the light guide layer 600. For example, the second light emitting element 1000 and the display panel may be fixed by a housing (not shown).

The second light emitting element 1000 may emit the second light L2 having a second wavelength range different from the first wavelength range. For example, the second light L2 may be ultraviolet or infrared light.

The second light emitting element 1000 may selectively emit the second light L2. That is, in the first mode state, the second light L2 may not be emitted from the second light emitting element 1000. In the second mode state, the second light L2 may be emitted from the second light emitting element 1000. In the second mode state, the second light L2 may be emitted from the light emitting surface 1001 of the second light emitting element 1000 in the first direction D1, and may be incident into the light guide layer 600 through the one side 602 of the light guide layer 600. The second light L2 incident into the light guide layer 600 may be transmitted to the display area DA by total reflection.

In the present embodiment, an optical pattern (e.g., the optical pattern 601 of FIG. 2A) may not be formed on the lower surface of the light guide layer 600 overlapping the peripheral area PA.

Hereinafter, an operation of the display device 13 in the first mode state and the second mode state will be described with reference to FIGS. 7A and 7B.

When the display device 13 is in the first mode state shown in FIG. 7A, the first light L1 (e.g., visible light) may be emitted from the first light emitting element 310 and light may not be emitted from the second light emitting element 1000. Accordingly, the light control layer 400 may not be discolored. Accordingly, the light control layer 400 may transmit the first light L1. That is, the first light L1 emitted from the light emitting area LA may not be blocked by the light control layer 400, but may be emitted to the outside of the display device 13 through the second substrate 900. Accordingly, the display device 13 may have the wide viewing angle in the first mode state.

When the display device 13 is in the second mode state illustrated in FIG. 7B, the second light L2 (e.g., ultraviolet light) may be emitted from the second light emitting element 1000. As described above, the second light L2 emitted from the second light emitting element 1000 may be transmitted to the display area DA through the light guide layer 600. In addition, a portion of the second light L2 transmitted to the light guide layer 600 may be emitted to the outside (e.g., the light control layer 400) of the light guide layer 600 by the scattering patterns 700. Accordingly, the light control layer 400 may be discolored. Accordingly, the first light L1 traveling toward the light control layer 400 among the first lights L1 emitted from the light emitting area LA may be blocked by the light control layer 400.

Among the first lights L1 emitted from the light emitting area LA, the first light L1 traveling toward the openings OP1 and OP2 may be not blocked by the light control layer 400 and may be emitted to the outside of the display device 13 through the second substrate 900. That is, when the display device 13 is in the second mode state, the light control layer 400 may block the first light L1 having an incident angle greater than or equal to a predetermined angle among the first lights L1 emitted from the light emitting area LA.

Accordingly, the display device 13 may have the narrow viewing angle in the second mode state.

When the display device 13 is switched back to the first mode state, the second light L2 may not be emitted from the second light emitting element 1000 and the color of the light control layer 400 may be restored to original state of the light control layer 400. Accordingly, the light control layer 400 may again transmit the first light L1 and the display device 13 may again have the wide viewing angle.

The present disclosure can be applied to various display devices that may include a display device. For example, the present disclosure can be applied to high-resolution smartphones, mobile phones, smart pads, smart watches, tablet PCs, in-vehicle navigation systems, televisions, computer monitors, notebook computers, and the like.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A display device comprising:
   a substrate including a display area including a light emitting area and a light blocking area, and a peripheral area surrounding at least a portion of the display area;
   a first light emitting element disposed in the light emitting area on the substrate and emitting a first light;
   a light guide layer disposed on the first light emitting element to cover the display area and the peripheral area, and transmitting a second light incident from the peripheral area to the display area;
   a first low refractive layer disposed on the light guide layer and having a refractive index smaller than a refractive index of the light guide layer;
   a second low refractive layer disposed under the light guide layer and having a refractive index smaller than a refractive index of the light guide layer; and
   a first light control layer disposed on the first low refractive layer and having a first opening exposing the light emitting area,
   wherein the first light control layer includes a photochromic material that is discolored by the second light.

2. The display device of claim 1, further comprising:
   a second light control layer disposed under the second low refractive layer and having a second opening exposing the light emitting area.

3. The display device of claim 2, wherein the second light control layer includes a photochromic material that is discolored by the second light.

4. The display device of claim 2, wherein the first light control layer directly contacts the first low refractive layer and the second light control layer directly contacts the second low refractive layer.

5. The display device of claim 2, wherein the first opening and the second opening overlaps with each other and the first light emitting element overlaps the first opening and the second opening, respectively.

6. The display device of claim 2, further comprising:
   a third light control layer disposed on the first light control layer, having a third opening exposing the light emitting area, and including a photochromic material that is discolored by the second light.

7. The display device of claim 6, further comprising:
   an insulating layer disposed between the first light control layer and the third light control layer, and covering the first light control layer.

8. The display device of claim 1, further comprising:
   a plurality of scattering patterns disposed between the light guide layer and an upper surface of the first low refractive layer, each of the scattering patterns overlapping the first light control layer.

9. The display device of claim 8, wherein each of the scattering patterns includes an insulating film and a plurality of scattering particles dispersed in the insulating film.

10. The display device of claim 8, wherein a width of each of the scattering patterns is smaller than a width of the first light control layer.

11. The display device of claim 1, wherein each of the first low refractive layer and the second low refractive layer includes a plurality of air bubbles disposed therein.

12. The display device of claim 1, wherein a refractive index of each of the first low refractive layer and the second low refractive layer is smaller than a refractive index of the light guide layer by about 0.2 or more.

13. The display device of claim 1, further comprising:
    a second light emitting element disposed in the peripheral area on the substrate and emitting the second light.

14. The display device of claim 1, further comprising:
    a second light emitting element disposed to face a side surface of the light guide layer and emitting the second light.

15. The display device of claim 1, wherein the first light is visible light and the second light is infrared or ultraviolet light.

16. A display device comprising:
    a substrate including a display area including a light emitting area and a light blocking area, and a peripheral area surrounding at least a portion of the display area;
    a first light emitting element disposed in the light emitting area on the substrate and emitting a first light;
    a light guide layer disposed on the first light emitting element to cover the display area and the peripheral area, and transmitting a second light incident from the peripheral area to the display area;
    a light control layer disposed in the display area on the first light emitting element, having an opening exposing the light emitting area, and disposed to be spaced apart from the light guide layer; and
    a low refractive layer disposed between the light guide layer and the light control layer, and having a refractive index smaller than a refractive index of the light guide layer,
    wherein the light control layer includes a photochromic material that is discolored by the second light.

17. The display device of claim 16, wherein the low refractive layer includes:
    a first low refractive layer disposed on the light guide layer; and
    a second low refractive layer disposed under the light guide layer.

18. The display device of claim 17, wherein each of the first low refractive layer and the second low refractive layer includes a plurality of air bubbles disposed therein.

19. The display device of claim 17, wherein the light control layer includes:
  a first light control layer disposed on the first low refractive layer; and
  a second light control layer disposed under the second low refractive layer.

20. The display device of claim 19, further comprising:
  a plurality of scattering patterns disposed between the light guide layer and an upper surface of the first low refractive layer, each of the scattering patterns overlapping the first light control layer.

* * * * *